United States Patent
Verge

(10) Patent No.: US 7,327,114 B2
(45) Date of Patent: *Feb. 5, 2008

(54) FAN CONTROL UTILIZING BI-DIRECTIONAL COMMUNICATIONS

(75) Inventor: Greg Verge, Lynnwood, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/559,599

(22) Filed: Nov. 14, 2006

(65) Prior Publication Data

US 2007/0200518 A1    Aug. 30, 2007

Related U.S. Application Data

(63) Continuation of application No. 11/365,066, filed on Feb. 28, 2006, now Pat. No. 7,141,950.

(51) Int. Cl.
*G05B 11/28* (2006.01)

(52) U.S. Cl. .................. 318/599; 318/254; 318/439; 388/811

(58) Field of Classification Search ............ 318/599, 318/439, 254, 268; 361/695
See application file for complete search history.

(56) References Cited

U.S. PATENT DOCUMENTS

| | | | |
|---|---|---|---|
| 4,328,586 A | 5/1982 | Hansen | |
| 5,003,457 A | 3/1991 | Ikei et al. | |
| 5,399,926 A | 3/1995 | Adams et al. | |
| 5,617,282 A | 4/1997 | Rall et al. | |
| 5,902,180 A | 5/1999 | Sunaga et al. | |
| 6,008,603 A * | 12/1999 | Jones et al. | 318/254 |
| 6,236,175 B1 * | 5/2001 | Mourad et al. | 318/268 |
| 6,381,406 B1 | 4/2002 | Smith et al. | |
| 6,487,463 B1 * | 11/2002 | Stepp, III | 700/79 |
| 6,553,076 B1 | 4/2003 | Huang | |
| 6,567,476 B2 * | 5/2003 | Kohl et al. | 375/293 |
| 6,597,972 B2 | 7/2003 | Emberty et al. | |
| 6,697,254 B1 * | 2/2004 | King et al. | 361/687 |
| 6,703,236 B2 * | 3/2004 | Atwood | 435/286.1 |
| 6,995,532 B2 * | 2/2006 | Frankel et al. | 318/268 |
| 2001/0031026 A1 * | 10/2001 | Kohl et al. | 375/354 |

(Continued)

OTHER PUBLICATIONS

Spinozzi, Joe, "Using a PWM signal to control cooling fan speed", Cyth Systems, Inc., 3 pgs., Jan. 2, 2004.

(Continued)

*Primary Examiner*—Paul Ip
(74) *Attorney, Agent, or Firm*—Marger Johnson & McCollom, PC

(57) ABSTRACT

A system and method for bi-directional communication between a system controller and a fan controller: The system operates in two modes and there are two communication paths between the system controller and the fan controller. The first communication path provides a PWM signal the frequency of which indicates the mode in which the system is operating. During the first mode, the duty cycle of the PWM signal on the first signal path indicates the desired fan speed. In the first mode, the second communication path carries a conventional tachometer signal. In the second mode the second communication path operates as a bi-directional communications signal path between said system controller and said fan controller.

20 Claims, 11 Drawing Sheets

U.S. PATENT DOCUMENTS

| | | |
|---|---|---|
| 2002/0120367 A1 | 8/2002 | Emberty et al. |
| 2003/0143964 A1 | 7/2003 | Otsuka et al. |
| 2003/0234625 A1* | 12/2003 | Frankel et al. .............. 318/268 |
| 2003/0236594 A1* | 12/2003 | Frankel et al. .............. 700/300 |
| 2004/0139181 A1 | 7/2004 | Baril et al. |
| 2004/0158333 A1* | 8/2004 | Ha et al. ....................... 700/3 |
| 2004/0186629 A1* | 9/2004 | Frankel et al. .............. 700/300 |
| 2004/0243684 A1 | 12/2004 | Ha et al. |
| 2005/0171648 A1* | 8/2005 | Frankel et al. .............. 700/300 |

OTHER PUBLICATIONS

Oljaca, Miro, "Meet demanding specs of control systems", Electronic Engineering Times India, 3 pgs., Jan. 9, 2005.

Zilog, Inc., "Intelligent Fan Controller Solutions—Z8 Encore! CP 8-bit Microcontrollers", (www.ZiLOG.com), 2 pgs., Jun. 2003.

Microchip Technology Inc., "Fan Control Function Pack Design Guide", Analog and Interface Product Solutions, 8 pgs., Aug. 2005.

Amtel Corporation, "AVR442: PC Fan Control using ATtiny13," 8-bit AVR Microcontrollers, Application Note, 10 pgs., Sep. 2005.

* cited by examiner

FAN CONTROL UTILIZING BI-DIRECTIONAL COMMUNICATIONS

RELATED APPLICATION

This application is a continuation of patent application Ser. No. 11/365,066 filed Feb. 28, 2006 now U.S. Pat. No. 7,141,950. Priority to application Ser. No. 11/365,066 field Feb. 28, 2006 is hereby claimed. The entire content of application Ser. No. 11/365,066 filed Feb. 28, 2006 is hereby incorporated herein by reference.

FIELD OF THE INVENTION

The present invention relates to the cooling fans for computer systems and more particularly to a system and method for controlling the speed of a cooling fan.

BACKGROUND

Many computer systems include a fan which moves air over the system's components in order to prevent excessive heating of the components. Many such fans are single speed fans that operate constantly while the computer is in operation.

Some more modern systems utilize variable speed cooling fans. The speed of such fans is increased when more cooling is desired. One such prior art system has a configuration such as that shown in FIG. 1. The system shown in FIG. 1 includes a system controller 1, a fan 2, and a fan controller 3. The connections between the system controller 1 and the fan controller 3 include a power line 1a, a ground line 1b, a Pulse Width Modulated (PWM) signal line 1c and a tachometer signal line 1d. A transistor switch 4 controls the voltage on tachometer line 1d.

The fan controller 3 is physically attached to the fan motor (not shown in FIG. 1) and it drives the coils in the fan motor causing the fan 2 to rotate. Both the system controller 1 and the fan controller 3 include microprocessors that perform various calculations digitally.

The system controller 1 provides a PWM signal on line 1c which indicates the desired speed of the fan. That is, the duty cycle of the PWM pulses on line 1c specify the desired speed of the fan. The PWM pulses on line 1c are low pass filtered to generate an analog voltage. This analog voltage is passed to an analog to digital converter to generate a digital signal. This digital signal indicates the desired fan speed to the fan controller 3 and this digital signal goes to the microprocessor in the fan controller 3.

The system includes a feedback loop via line 1d. A tachometer in fan controller 3 controls transistor 4. Transistor 4 produces pulses on line 1d that indicate the actual speed of the fan. At the system controller 1, the frequency of the pulses on line 1d is converted to a digital signal and provided to the microprocessor in the system controller.

It is noted that with the system shown in FIG. 1, only one parameter is communicated in each direction. Desired speed is communicated from system controller 1 to fan controller 3 on line 1c. Measured fan speed is communicated from fan controller 3 to system controller 1 on line 1d.

It is also noted that two signal conversions are required in the system described above. The PWM signal is converted to a digital signal in the fan controller 3 and the frequency signal on line 1d is converted into a digital signal indicating fan speed at the system controller 1. Such conversions are inherently somewhat inaccurate, especially in low cost devices.

SUMMARY OF THE INVENTION

The present invention provides a system and method for bi-directional communication between a system controller and a fan controller. The system includes two communication paths between the system controller and the fan controller. The first path provides a PWM signal the frequency of which indicates the mode in which the system is operating. During said first mode of operation, the duty cycle of the PWM signal on said first path indicates the desired fan speed. The second communication path serves one function in a first mode of operation and a second function in a second mode of operation. In the first mode, the second communication path carries a conventional tachometer signal. In the second mode, the second communication path operates as a bi-directional communications link between the system controller and the fan controller.

DETAILED DESCRIPTION

Figure 1:
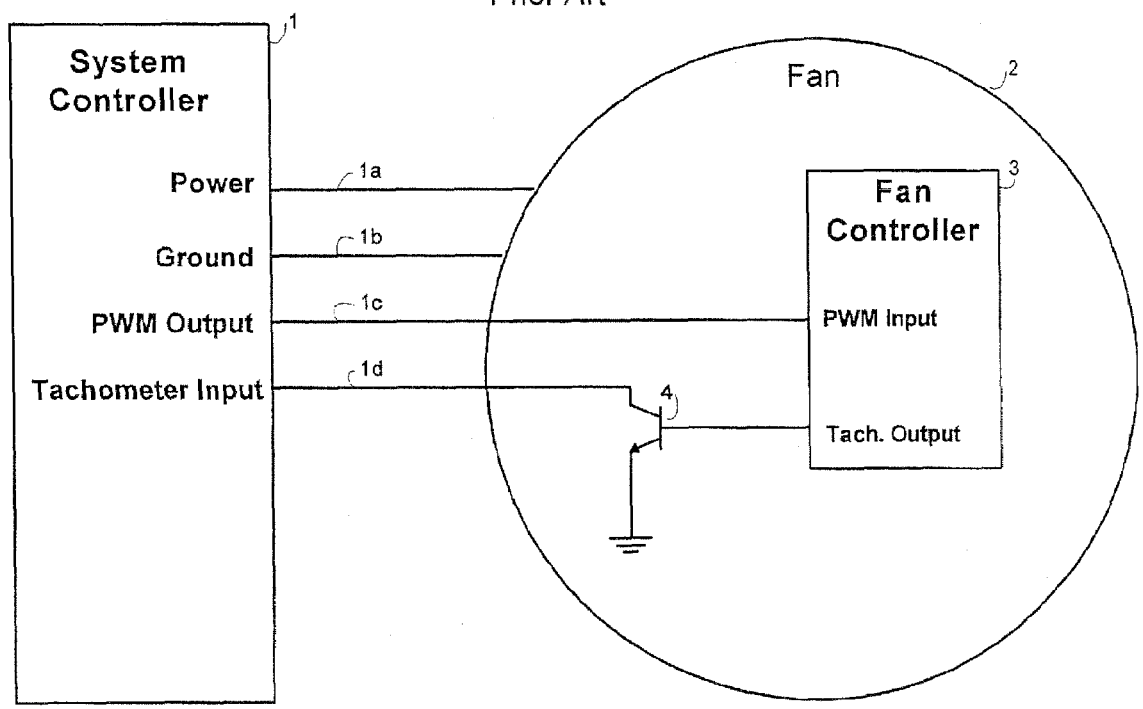
FIG. 1 shows a prior art system.

Several preferred embodiments of the present invention will now be described with reference to the accompanying drawings. Various other embodiments of the invention are also possible and practical. This invention may be embodied in many different forms and the invention should not be construed as being limited to the embodiments set forth herein.

The figures listed above illustrate a preferred embodiment of the invention and the operation of such embodiments. In the figures, the size of the boxes is not intended to represent the size of the various physical components. Where the same element appears in multiple figures, the same reference numeral is used to denote the element in all of the figures where it appears.

Only those parts of the various units are shown and described which are necessary to convey an understanding of the invention and the embodiments to those skilled in the art. Those parts and elements not shown are conventional and known in the art.

Figure 2:
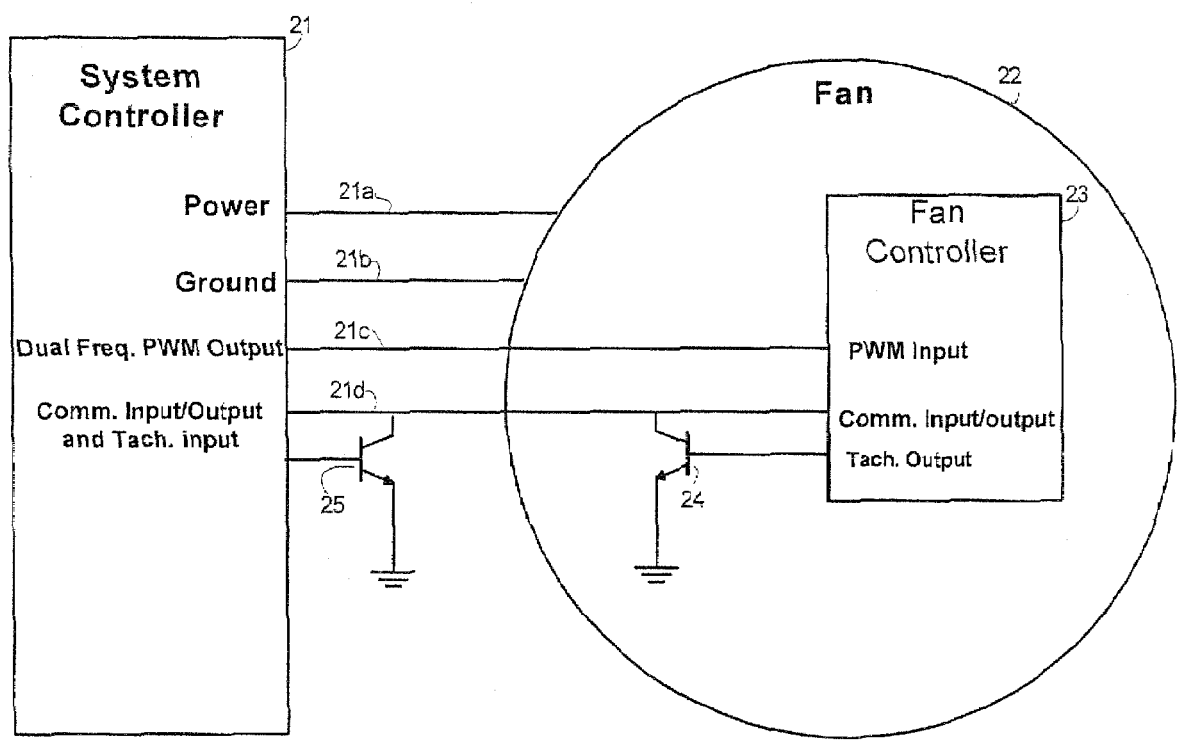
FIG. 2 shows a first embodiment of the present invention.

The overall configuration of a first embodiment of the invention is shown in FIG. 2. This embodiment includes a system controller 21, a fan 22 and a fan controller 23.

A power line 21a, a ground line 21b, and two signal lines 21c and 21d connect the system controller 21 to the fan controller 23.

As will be explained in detail below, the system has two modes of operation. The first mode of operation is a compatibility or legacy mode in which the system operates similar to the operation of the prior art system shown in FIG. 1. In the second mode, there is bi-directional communication between the system controller 21 and the fan controller 23 over the line 21d. The frequency of the PWM pulses on line 21c is used to indicate the mode in which the system is operating.

The frequency of the PWM signals on line 21c indicates in which of the two modes the system is operating. In the first mode, the system operates in legacy mode and the signals on line 21d are tachometer signals indicating fan speed. In the second mode, the system operates in a bi-directional communication mode and the signals on line 1d are modulated signals transferring digital data.

During the first mode of operation, the system controller 21 indicates the desired fan speed by the duty cycle of the PWM pulses on line 21c. That is, the duty cycle of the pulses on line 21c indicates the desired fan speed. In the second mode, the speed of operation is indicated by digital data transferred over line 21d. It is noted that in some situations the fan operates at a default speed.

When the frequency of the PWM pulses on line 21c is relatively low, (for example, 25,000 pulses per second) the system operates in the legacy mode. When the frequency of the PWM is relatively high (for example, 50,000 pulses per second) the system operates in a new the bi-directional communication mode.

Figure 3:
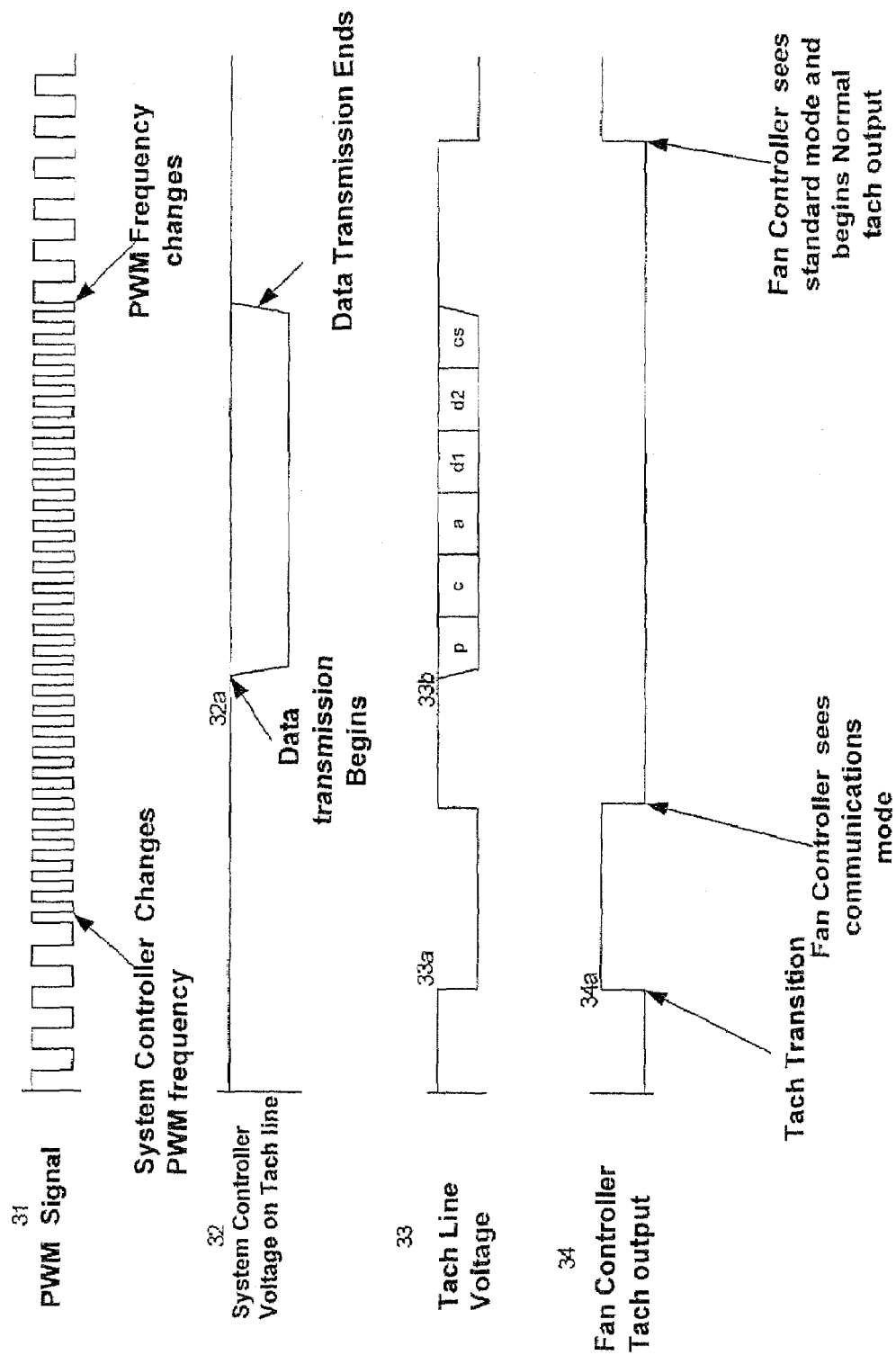
FIGS. 3 and 4 are timing diagrams showing the signals on various lines.
Figure 4:
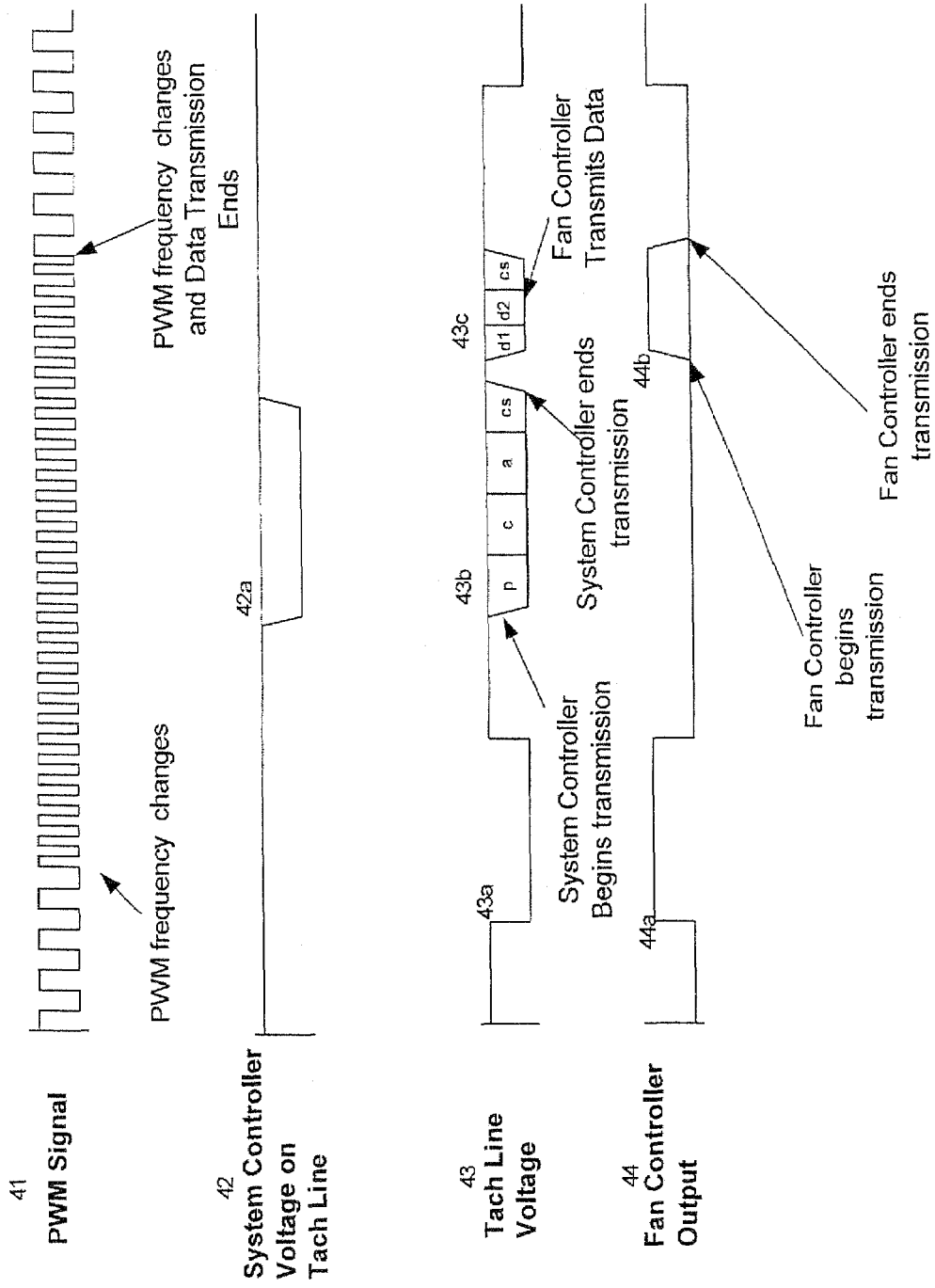

FIG. 3 shows the waveforms at various points in the system when the system goes from the legacy mode of operation to the bi-directional communication mode wherein data and commands are transferred between the system controller 21 to the fan controller 23. FIG. 4 shows the waveforms on the various lines when the system goes from the legacy mode of operation to the bi-directional communication mode and data is being transmitted from the fan controller 23 to the fan controller 21. It is noted that in the particular embodiment shown here, the mode of operation of the system is switched between the two modes of operation. However, in other embodiments, the system continuously operates in the second or bi-directional communication mode.

Waveform 31 in FIG. 3 indicates how the system controller 21 changes the frequency of the PWM signal on line 21c to indicate that the system should change from legacy mode to bi-directional communication mode.

Waveform 32 indicates the voltage on line 21d as seen by the system controller 21. In legacy mode, the system controller 21 applies a voltage to line 21d. When fan controller 23 closes transistor 24, the line 1d is pulled to ground. For example, the system controller can apply five volts to line 21d and when transistor 24 is closed the line 21d is pulled to ground. As indicated by waveform 32 when data transmission begins (indicated by the reference numeral 32a in the diagram) the system controller 21 modulates the signal on line 1d in order to transmit data using a conventional serial communication protocol.

Waveform 33 represents the signal on line 21d as seen by the fan controller 23. In legacy mode, line 21d is pulled low by the fan controller at a frequency that indicates the fan speed. That is, in the legacy mode the frequency of the pulses on line 21d indicate the fan speed. Pulse 33a shown on waveform 33 is a pulse that occurs during the legacy mode of operation. Note pulse 33a is merely representative of such pulses. In FIG. 3, the boxes under the waveform 33 (at the point indicated reference number 33b) indicate that the system controller 21 is modulating the signal on line 21d to transmit data. The data transmitted is indicated by the blocks marked as follows:

Box "p" indicates a conventional preamble or sync signal that is used to synchronize the transmission operation in the system controller 21 with the reception in fan controller 23.

Box "c" indicates the transmission of a command that is to be performed by the microprocessor in fan controller 23.

Box "a" indicates the address of data that is to be accessed by the microprocessor in fan controller 23.

Box "d1" indicates data byte 1 of "n" data bytes.

Box "d2" indicates data byte 2 of "n" data bytes. (There can be any number of such data bytes)

Box "cs" indicates a conventional checksum to insure that the previous bytes are valid.

The system controller 21 can transmit both commands and data to the fan controller 23. The commands that can be transmitted are conventional microprocessor commands. Examples of the types of data and commands that can be transmitted from the system controller 21 to the fan controller 23 are:

a) The default fan speed that fan controller 23 uses during the start up phase of operation, prior to receiving and interpreting a speed signal on line 21c.

b) A parameter that specifies a delay time period before the fan starts at system power up time.

c) Default parameters that specify how the fan should operate if the bi-directional communication with the controller 21 is for some reason lost.

d) A command indicating that the fan controller 23 should transmit certain data to the system controller 21.

Waveform 34 shows an example of the signal that the fan controller applies to the transistor 24 in order to transmit fan speed to the system controller. It is noted that when the fan controller 23 detects a switch to communication mode, that is, when data is being transmitted on line 21d, the transistor 24 is held in the open state so that the system controller 21 can modulate the signal on line 21d.

Figure 8:
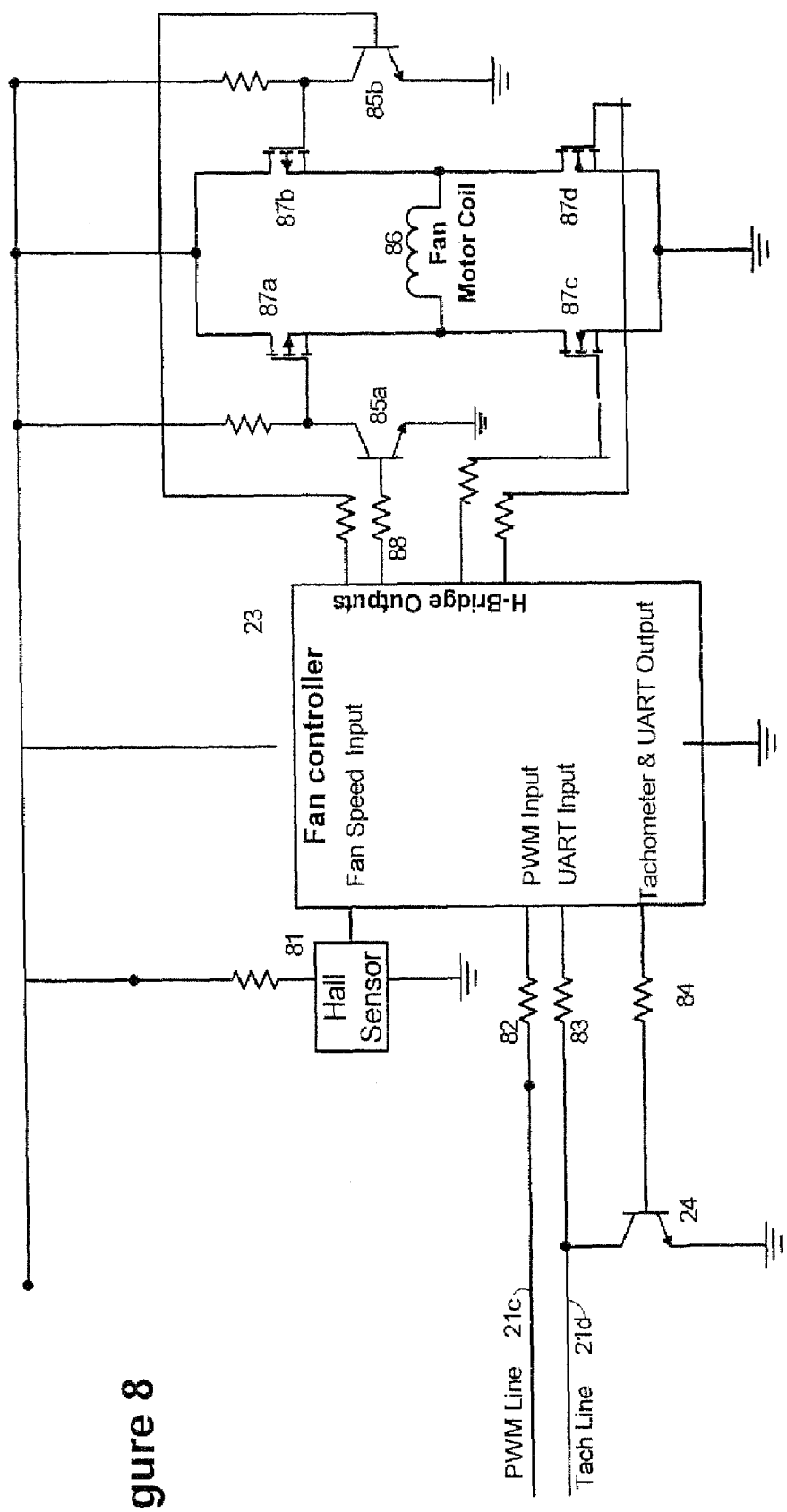
FIG. 8 shows the connections to the fan controller.

It is noted that the wave form 34 represents the control signal to the base of transistor 24. The signal applied to the base of transistor 24 is a signal that is generated by a tachometer in the fan controller. As shown in FIG. 8, this signal is generated by a hall sensor in a conventional manner.

FIG. 4 shows examples of the waveforms that occur when data is transferred from the fan controller 23 to the system controller 21. Note that in waveform 43, a point 43b, the system controller 21 sends a command to the fan controller 23. This command tells the fan controller 23 to begin transmitting data and this happens at point 43c.

Waveform 41 illustrates a change in PWM frequency which indicates a shift to bi-directional communication mode.

Waveform 42 indicates the voltage applied to line 1d by the system controller 21. A point 42a, the signal on line 1d is modulated in order to send a command to fan controller 23.

Waveform 43 indicates the signal on line 21d. At point 43a, there is a conventional tachometer pulse. At point 43b, the system controller sends information by modulating line 21d. At point 43c, the fan controller sends information by modulating line 21d.

Waveform 44 indicates how the fan controller 23 controls the base control line of transistor 24. At point 44a, the transistor 24 is closed to transmit a tachometer pulse. At point 44b, the transistor control line is modulated to transmit data.

Examples of the data that the fan controller 23 can transmit to the system controller 23 are:
  a) A parameter indicating the actual speed of the fan 22.
  b) A parameter indicating the actual temperature of the air flowing through the fan.
  c) A parameter indicating the amount of current in the fan coil at a particular time.
  d) A parameter indicating the number of locked rotor events that have occurred.
  e) A parameter indicating some type of abnormal fan operation which may predict future fan failure.

Thus, during the second mode of operation, the system controller 21 sends digital data to the fan controller 23 that can for example indicate the desired speed at which the fan can operate. It can also send other data such as the speed at which the fan should operate under default conditions. During the second mode of operation the fan controller 23 can send data to the system controller indicating the speed and data concerning other operating conditions of the fan.

Figure 5:
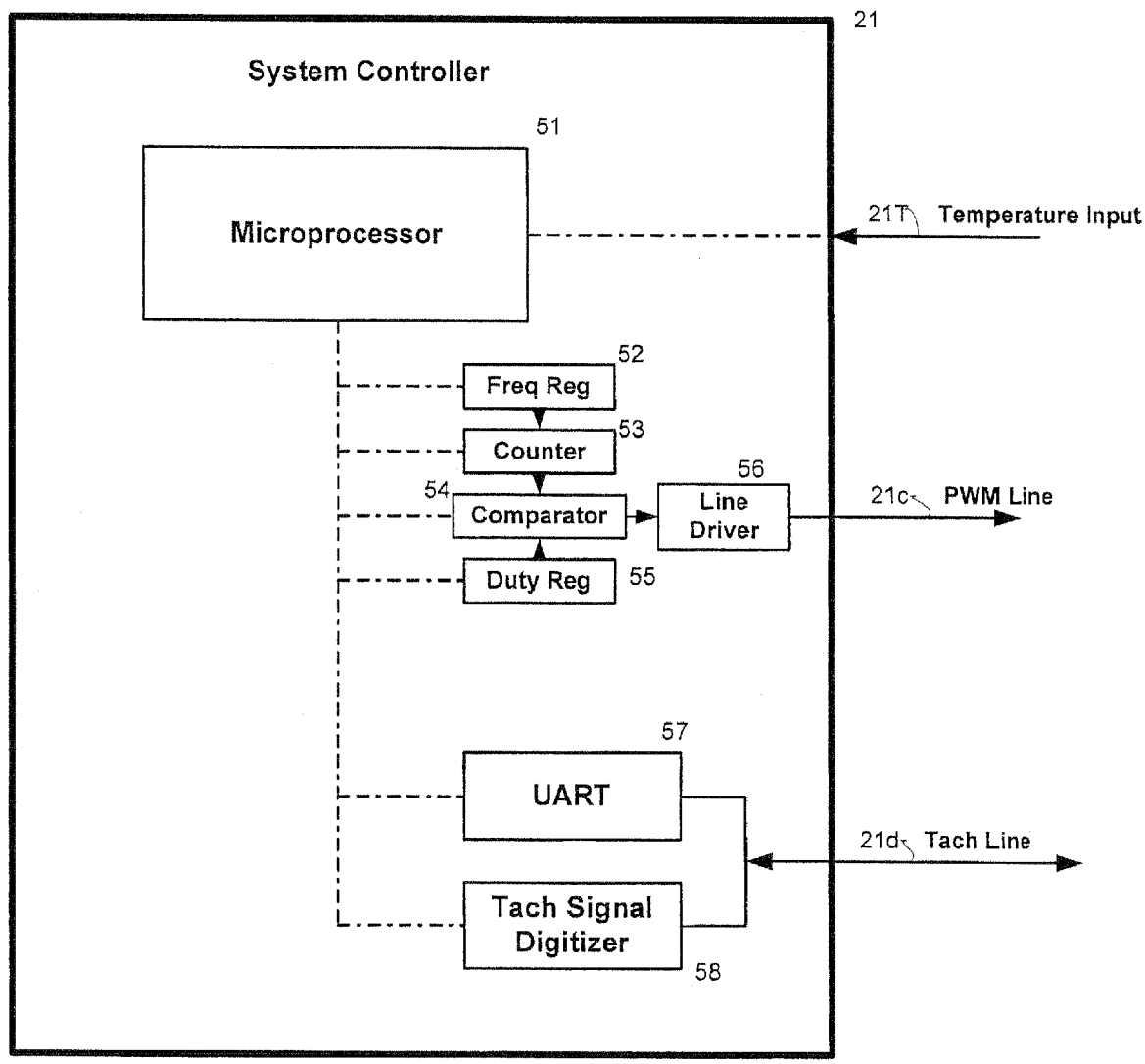
FIG. 5 is a block diagram of the relevant parts in the system controller.

FIG. 5 is a block diagram of the relevant components in the System controller 21. It is noted that the system controller includes other conventional parts. The conventional parts of system controller 21 are not shown in FIG. 5 or described herein.

System controller 21 includes a conventional programmed microprocessor 51 that controls the operation of the system. Microprocessor 51 controls and interacts with the other components shown in FIG. 5 as explained below. Microprocessor 51 also handles a variety of conventional operations that are not relevant to the present invention. Such conventional operations are not described herein.

System controller 21 also includes registers 52 and 55, a counter 53, a comparator 54, a line driver 56, a conventional "Universal Asynchronous Receiver Transmitter" (UART) 57 and a conventional tachometer signal digitizer 58.

Register 52 is used to store a number which represents the desired frequency of the pulses on the PWM line 21c. Register 55 is used to store a number which represents the desired duty cycle of the pulses on line 21c. The number in register 55 also represents the desired speed of the fan 22.

Counter 53 is a conventional count down counter. This counter is loaded with the number stored in register 52 and the counter 53 then counts down in a conventional manner. Comparator 54 compares the number in register 55 with the count in the counter 53. If the count in counter 53 is higher than the number stored in register 55, the output of comparator 55 causes the line drive 56 to apply a high voltage to line 21c. If the count in counter 53 is lower than the number stored in register 55, the output of comparator 55 causes the line drive 56 to apply a low voltage to line 21c. When counter 53 reaches zero, it is reset to the number in register 52.

UART 57 is a conventional "Universal Asynchronous Receiver Transmitter" device. A UART is a computer component that handles asynchronous serial communication on a signal line. For example, many computers contain UARTs to manage their serial ports. UART 57 and a corresponding UART in fan controller 23 control the transmission of data on tach line 21d. This occurs when the PWM pulses on line 21c have a relatively high frequency.

Data is loaded into register 52 and 55 and into UART 57 in a conventional manner from microprocessor 51.

Tachometer signal digitizer 58 is a conventional device that takes the tachometer pulses on line 21d, and provides a digital number to microprocessor 51 indicating the frequency of the pulses and hence the actual frequency of fan 22. The tachometer pulses appear on line 21d when there are relatively low frequency PWM pulses on line 21c.

Figure 6:
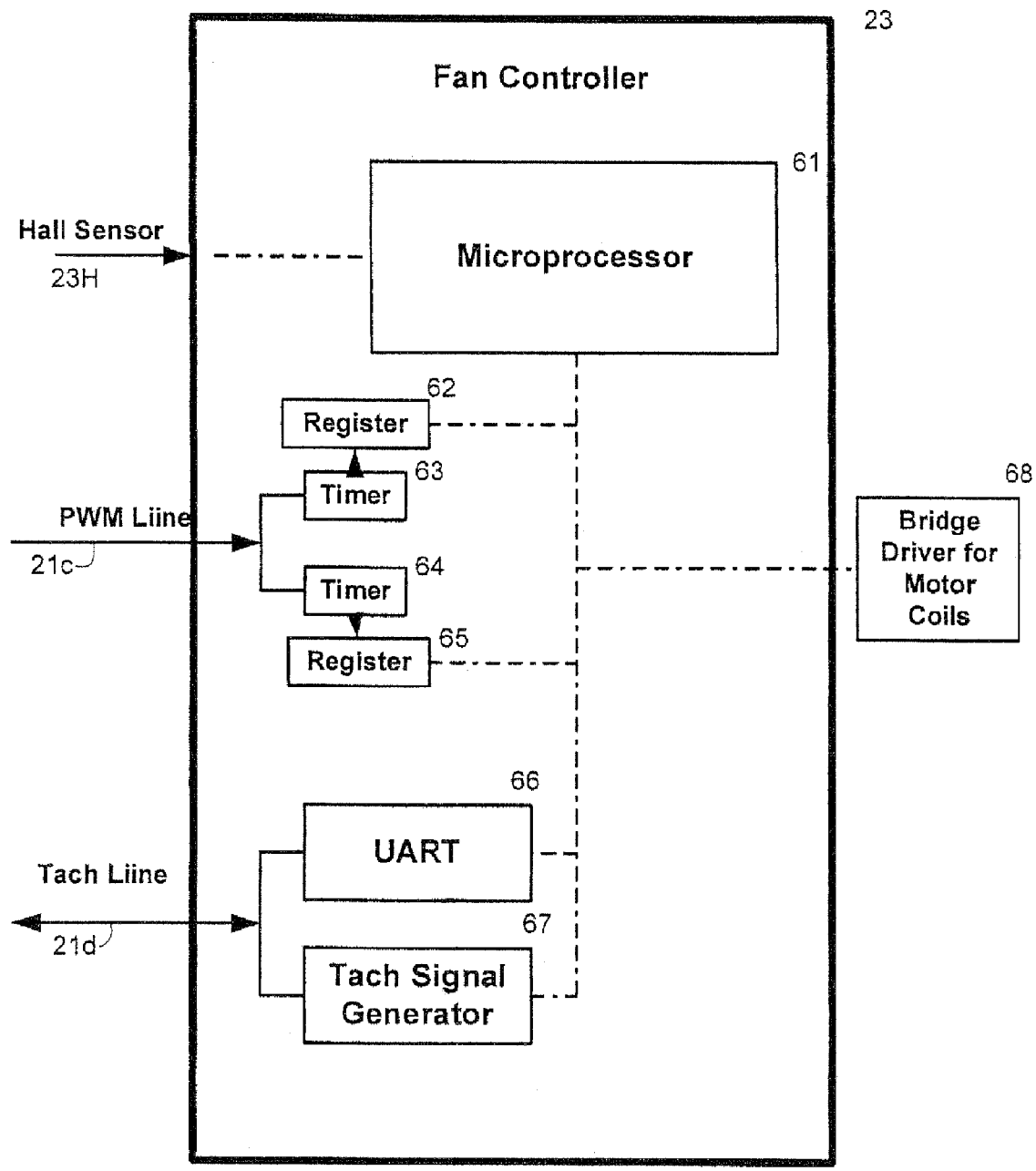
FIG. 6 is a block diagram of the relevant parts in the fan controller.

FIG. 6 is a block diagram of the major components in fan controller 23. Fan controller 23 contains a conventional microprocessor 61. Microprocessor 61 controls and interacts with the various components shown in FIG. 6 as explained below. Microprocessor 61 also performs a number of conventional operations not explained herein.

Fan controller 23 also contains registers 62 and 65, timers 63 and 64, UART 66, tachometer signal generator 67 and bridge driver for motor coils 68.

The PWM signals on line 21c trigger, (that is, reset), the operation of two timers 63 and 64. Timer 63 is reset by the raising edge of each pulse on line 21c and timer 64 is reset by the falling edge of each pulse on line 21c. The value or count in the timers 63 and 64 is transferred to registers 62 and 65 when the timers are reset.

The microprocessor 61 calculates the PWM frequency from the time period that elapses between two raising edges as measured by timer 63. At system start-up the timers 63 and 64 are initially started at the same time (that is, in synchronization). One timer is reset by the raising pulse edge and the other by the falling pulse edge. This allows the system to calculate pulse width by measuring the time period between a rising edge as measured by time 63 and a falling edge as measured by time 64. The PWM duty cycle is calculated by dividing the PWM pulse width by the PWM period. It is noted that in an alternate embodiment a single timer is used to perform the function of timers 63 and 64. In such an embodiment, the single timer performs the function of timer 63 during a first pulse on line 21c and the function of timer 64 during a second pulse on line 21c.

The UART 57 in the system controller communicates with the UART 66 in the fan controller 23 allowing the system controller 21 and the fan controller 23 to exchange data. This type of communication between two UARTs is conventional.

The Tach signal generator 67 is conventional and it sends fan speed data to the system controller 21 in a conventional manner when the system is operating in legacy mode.

Figure 7:
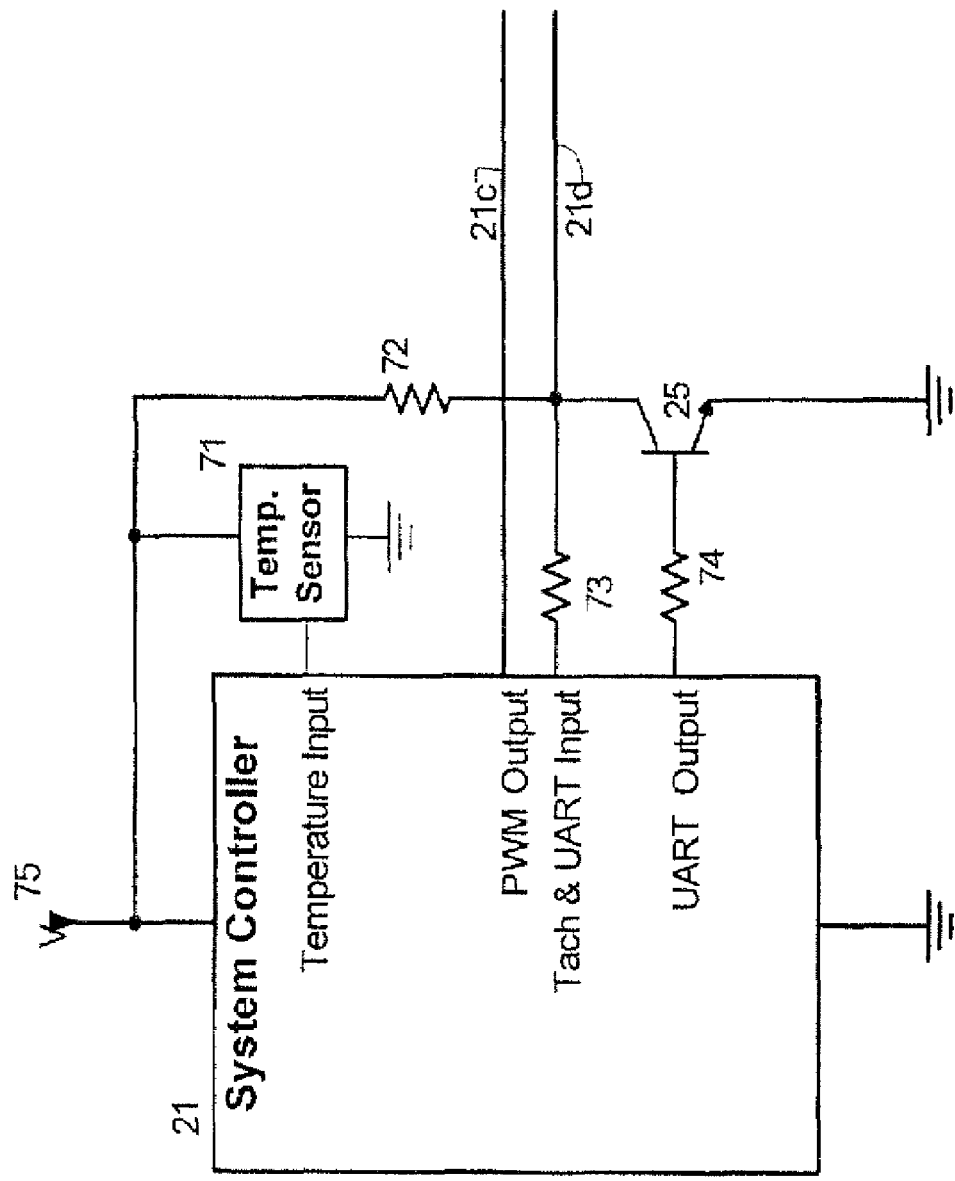
FIG. 7 shows the connections to the system controller.

FIGS. 7 and 8 show in more detail the connections between the system controller 21 and the fan controller 23. The connections to the system controller 21 are shown in FIG. 7.

A temperature sensor 71 provides a temperature input to the system controller 21 and to the microprocessor 61 in a conventional manner. A voltage supply 75 provides power to the system. Resistors 72, 73 and 74 provide conventional current limiting functions. It is noted that there are two connections from the system controller 21 to communication line 21d. One output is from the UART 57 and it controls the base of transistor 25 which drives line 21d low. The second connection to line 21d is a tachometer and UART input line. The PWM output is connected to line 21c.

The connections to the fan controller 23 are shown in FIG. 8. The output of the fan controller 23 drives the fan motor coil 86 in a conventional manner. Current in the fan motor coil 86 is controlled by transistors 87a, 87b, 87c and 87d which are connected in a bridge circuit in a conventional manner. Outputs 88 directly control transistors 87c and 87d and transistors 87a and 87b are controlled through inverters 85a and 85b. The bridge circuit controlling the fan motor coil 86 is conventional.

A conventional hall sensor 81 provides a fan speed signal to the fan controller 23. The tachometer and UART output line controls the base of transistor 24 through resistor 84.

Transistor 24 can pull line 21*d* low thereby generating a signal on line 21*d*. A connection through resistor 83 provides an input to UART 66.

Figure 9:
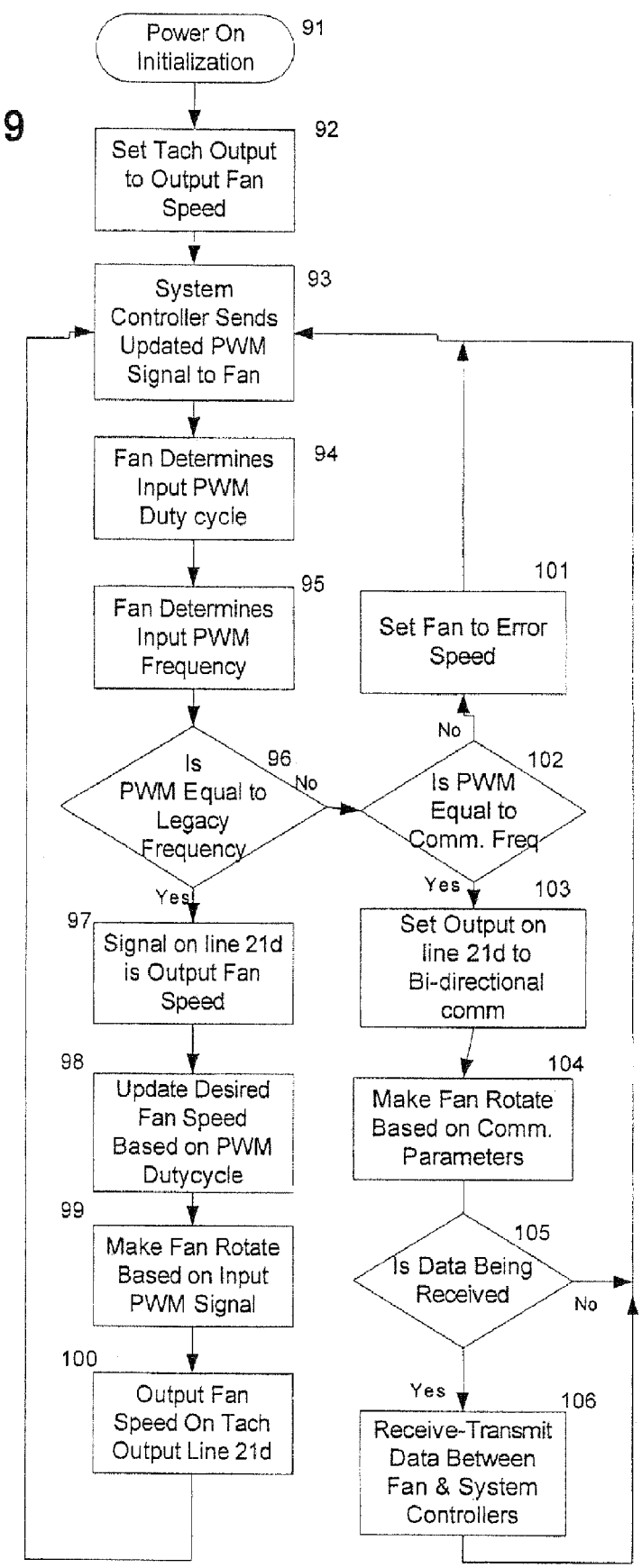
FIG. 9 is a flow diagram explaining the operation of the system.

FIG. 9 is a flow diagram illustrating the operation of the embodiment described in the previous figures. The microprocessor 51 in the system controller determines the desired operation speed for the fan in various conventional ways. That it can for example, take into account the temperature input 21T and the load on the system.

Various other factors can also be taken into consideration in determining the desired fan speed and the mode in which the microprocessor would like the system to operate.

When the system is operating in the first mode, the microprocessor 51 controls the number in register 55 and causes the duty cycle of the PWM pulses on line 21*c* to indicate the desired fan speed. Such an operation is conventional. When based on some pre-programmed conditions the system controller determines that it would like to system to switch to the bi-directional communication mode, it increases the frequency of the pulses on line 21*c*. During this second mode, the system controller will send digital data to the fan controller 23 indicating the desired fan speed. Initially, during this second mode, the fan will operate at a default speed, the value of which is stored in the fan controller.

FIG. 9 explains the operation of the system, beginning with system initiation. Block 91 indicates the system initialization operation at power up. The fan speed is set to a default value and the signal on line 21*d* is set to the tachometer output. That is, at power up, the system operates in legacy mode. Furthermore, at system initialization, timers 63 and 64 in fan controller 23 are reset and in the system controller 21, initial values are loaded into registers 52 and 55 by microprocessor 51.

Block 93 indicates that the system controller begins (or after initialization continues to send) a PWM signal to the fan controller 23. The fan controller 23 determines the duty cycle and the frequency of the PWM signals as indicated by blocks 95 and 96.

At block 96, a determination is made as to whether the PWM signals are in legacy mode or in bi-directional communication mode. If the PWM signals are at the slow frequency, the system proceeds to block 97. The signal on line 21*d* continues to be the legacy tachometer signal. As indicated by blocks 98 and 99, the fan is made to operate at the speed specified by the PWM signal that was received. As indicated by block 100, the fan speed is outputted on line 21*d*.

If, at block 96, it is determined that the PWM signal is at a high frequency, the system switches to bi-directional communication mode. It is noted that such a switch would be initiated by the system controller 21 in response to the detection of some conditions pre-programmed into the system controller. If a high frequency PWM signal is detected, first a check is made by block 102 to insure that the PWM frequency is in fact the bi-direction communication mode frequency. If it is not, the fan is set to a default error speed and the system returns to block 93.

If in fact the PWM frequency is the frequency that indicates bi-directional communication (decision block 102) the UARTs are activated and the UARTs provide the output to line 21*d* as indicated by block 103. Note that the UART in the fan controller is activated as a response to the PWM signal. The UART in the system controller will be set to this mode when the system controller initiates the bi-directional mode operation.

At this point there will be communication between the micro processor in the system controller 21 and the micro processor in the fan controller 23. The fan is made to rotate at a speed determined by parameters stored in the microprocessor 61 in the fan controller as indicated by block 104. The parameters that indicate the fan speed during the second mode of operation can be changed by commands from the system controller 21.

A test to determine this is made at block 105. If there is in fact no communication, the system returns to block 93. If there is communication, the data is received and the fan set to the new parameters.

The program in the microprocessor 51 in the system controller can be set in a variety of ways depending upon the desires of the system operator. In some situations, after system start up, the system controller will immediately signal a switch to the bi-directional communication mode. Data will then be continually exchanged between the system controller 21 and the fan controller 23 and the fan will continuously be operated in accordance with digital parameters sent to the fan controller 23 by the system controller 21.

In other applications, the system will normally operate in legacy mode and only switch to bi-directional communication mode when certain special conditions exist.

It is noted that in the above described embodiment the frequency of the PWM signal is modulated by the combined operation of the frequency register 52, the counter 53 and the comparator 54. The duty cycle of the PWM signal is modulated by the combined action of the duty cycle register 55 and the comparator 55. A first type of information is transmitted utilizing the frequency of the PWM signal and a second type of information is transmitted utilizing the duty cycle of the PWM signal.

The frequency of the PWM signal is utilized to switch the fan controller from a first mode of operation to a second mode of operation. The duty cycle of the PWM signal is utilized to convey information about the desired fan speed.

In the first embodiment described above asynchronous bi-directional communication is used. The PWM line 21*c* is a first communication link between the system controller 21 and the fan controller 23. The line 21*d* is a second communication link that transmits either a tachometer signal or an asynchronous digital signal between UARTs 57 and 66.

Figure 10A:
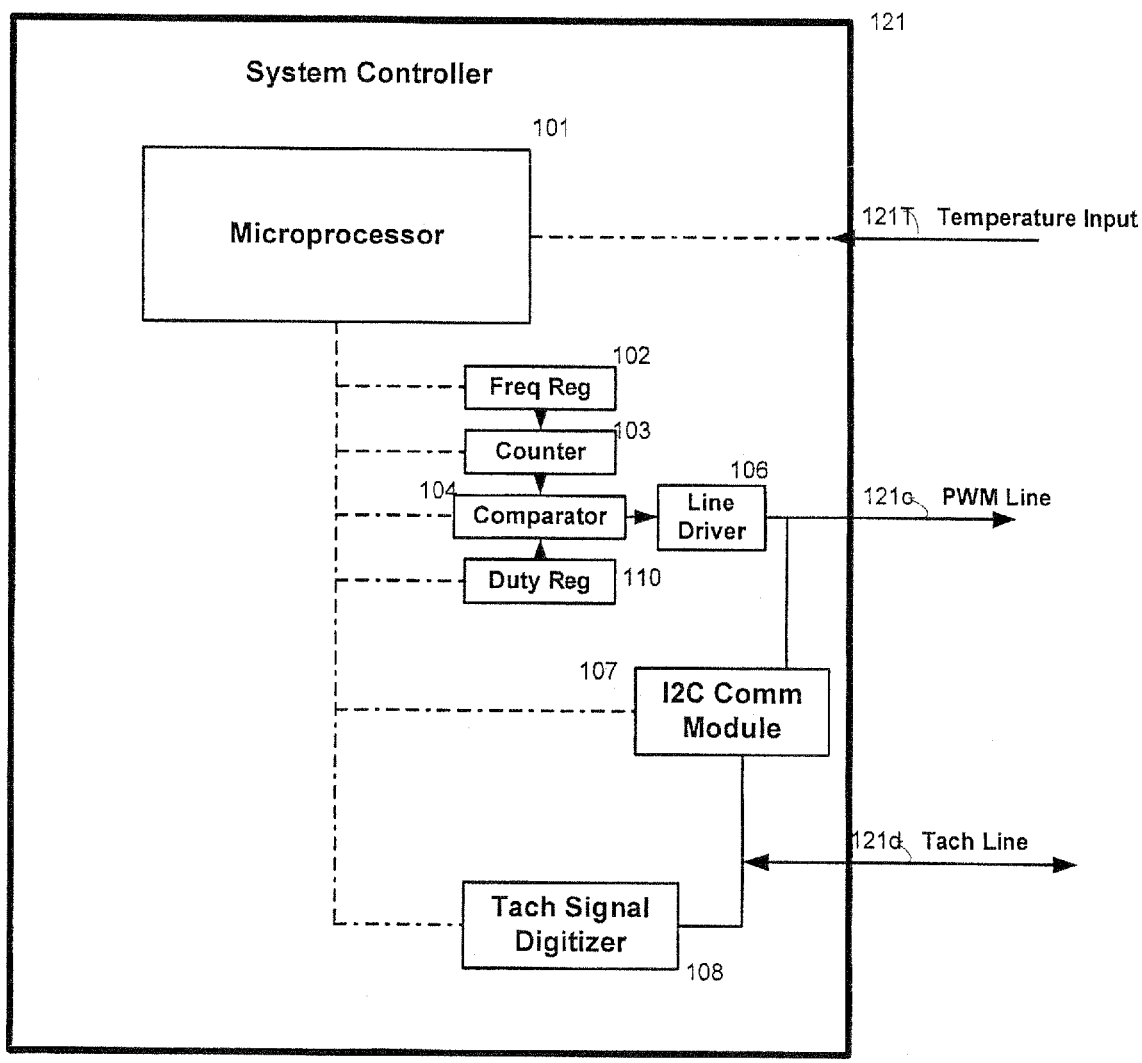
FIGS. 10A and 10B show an alternate embodiment that utilizes I2c communication.
Figure 10B:
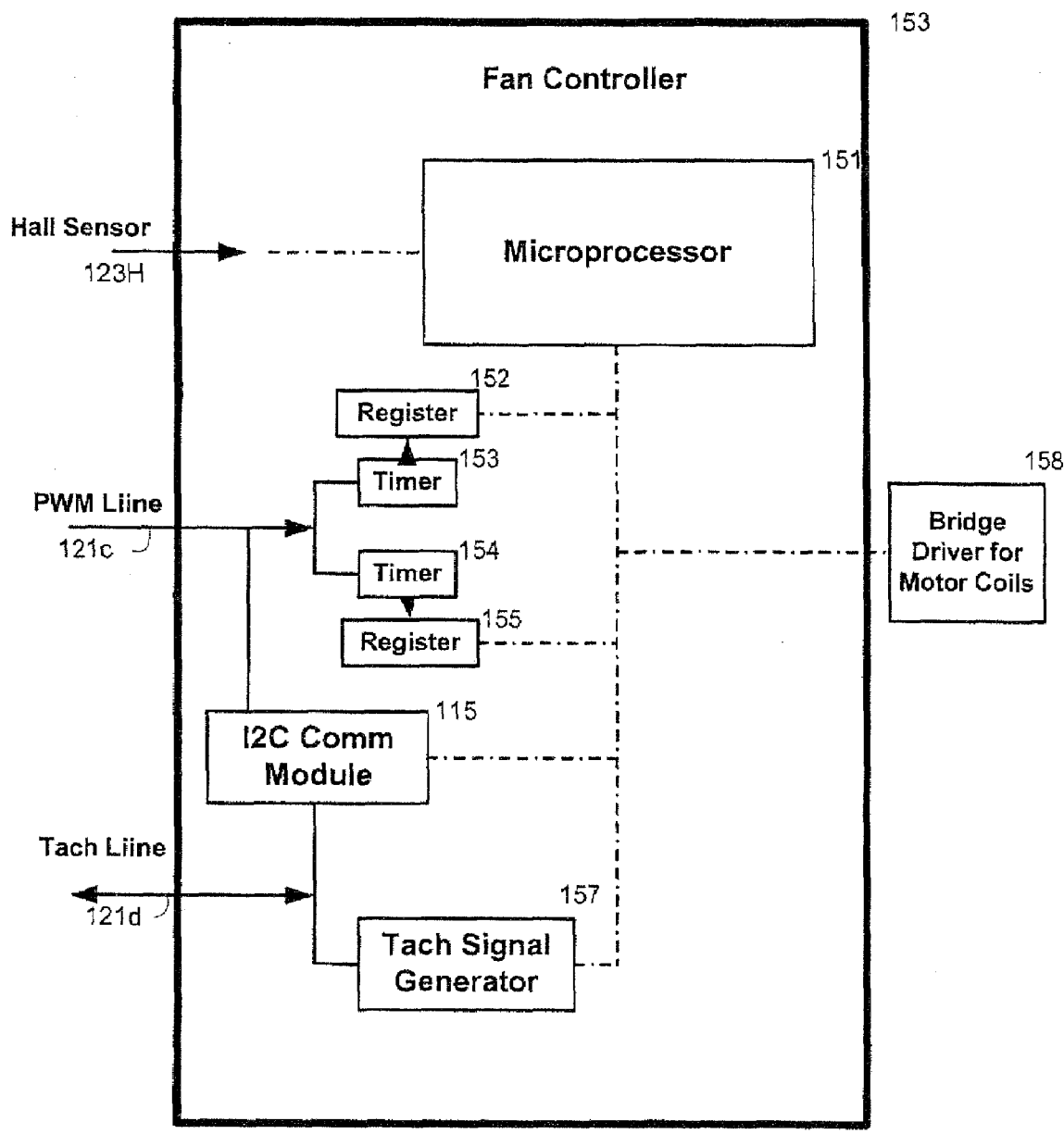

An alternate embodiment is shown in FIGS. 10A and 10B. The alternate embodiment includes a system controller 121 and a fan controller 123 that are connected by signal lines 121*c* and 121*d*. The power and ground lines are not shown in FIGS. 10A and 10B. This alternate embodiment utilizes the type of communication protocol known as Inter-IC or I2C. The I2C protocol is a multi-master bus type of communication. This means that the units at either end of the bus can act as a master and initiate communication; however, in this embodiment the I2C module in the system controller acts as the master. In this second embodiment, during the first or legacy mode of communication, the system operates as previously described. That is, line 121*c* operates as a first communication path that carries PWM signals and line 121*d* operates as a second communication path that carries a tachometer signal. However, during a second mode of operation, line 121*d* provides a second communication path, but line 121*c* provides a clock signal for the communication that occurs on line 121*d*.

As is well know in the art I2C communication requires two signal lines. One signal line transmits a clock signal and a second signal line carries bi-directional modulated communication signals.

System controller 121 shown in FIG. 10A includes registers 102 and 110, counter 103, comparator 104, line driver 106, and tachometer signal digitizer 108 that operate similar to the corresponding components in the first embodiment. In the second, that is, in the bi-directional communication mode, the communication is handled by I2C communication module 107. I2C communication modules are commercially available. The various components in the system controller 121 are controlled by the microprocessor 101 as is conventional.

The fan controller 123 shown in FIG. 10B includes registers 152 and 155, timers 153 and 154, bridge driver 158 and tachometer signal generator 157 that operate similarly to the corresponding components in the previously described embodiment. Fan controller 123 also includes an I2C communication module 150 that is similar to the corresponding module in the system controller 121.

In the embodiment shown the I2C controller in the system controller 121 operates as a master and the I2C controller in the fan controller operates as a slave. Thus the switch from the first to the second mode of communication is under control of the system controller as in the first embodiment. Thus, when the system controller generates high frequency pulses on line 121c, the I2C controllers begin to communicate with each other.

The I2C communication protocol requires two signal lines, one for the system controller (master) to send the clock to the fan controller (slave) and a second to send the bi-directional data. In the second mode of operation, the PWM line 121c provides the I2C clock from the system controller 121 to the fan controller 123. When the fan controller 121 detects a high frequency PWM signal on line 121c, the system enters the second or communications mode of operations. After this second mode begins, the fan controller stays in this mode independent of the frequency of the signals on line 121c. This allows the PWM line 121c to provide the I2C clock signal. The fan controller only goes back to legacy mode, that is, to the first mode, when the microprocessor 151 in fan controller 123 provides an appropriate command to the I2C module 150.

The microprocessor 151 will generate such a command when it receives a command from the fan controller indicating that it should do so. The microprocessors in the system controller 121 and the fan controller 123 can be programmed so that when the system is in bi-directional communication mode, the system controller can send a command telling the fan controller to switch back to legacy mode. Likewise, when the system is in bi-directional communication mode various data, such as default parameters, and command can be sent from the system controller 121 to the fan controller 123. Likewise in the communication mode, various data concerning the operation status of the fan can be sent from the fan controller 123 to the system controller 121.

In this second embodiment, the system switches from the legacy mode to the bi-directional communication mode when the frequency of the pulses on line 121c is increased. This is similar to the corresponding operation in the first embodiment. The use made of the communication paths between the system controller 121 and the fan controller 123 changes when the system switches from the legacy mode to the bi-directional communication mode.

While the invention has been shown and described with respect to preferred embodiments thereof, it should be understood that a wide variety of other embodiments are possible without departing from the scope and spirit of the invention. The scope of the invention is only limited by the appended claims.

I claim:

1. A computer fan control system for controlling the operating speed of a fan, said fan control system being able to operate in multiple modes, said fan control system including:
   a system controller which specifies a desired speed for said fan, said desired speed being subject to change over time,
   a fan controller,
   a first connection for carrying signals between said system controller and said fan controller, said system controller being adapted to transmit a Pulse Width Modulated (PWM) signal on said first connection, the frequency of said PWM signal indicating a mode of operation for said fan control system and the duty cycle of which indicates a desired fan speed, and
   a second connection between said system controller and said fan controller, said system controller and said fan controller being adapted to communicate bi-directionally over said second connection during a certain mode of operation of said fan control system and said fan controller being adapted to transmit a tachometer signal indicating fan speed over said second connection during a particular mode of operation of said fan control system.

2. The system recited in claim 1 wherein said system controller and said fan controller each include UARTs connected to said second connection, said UARTs providing bi-directional asynchronous communication between said system controller and said fan controller during a certain mode of operation.

3. The system recited in claim 1 wherein said system controller and said fan controller include communication modules that communicate bi-directionally on said second connection during a selected mode of operation.

4. The system recited in claim 1 wherein:
   said system controller includes a first Universal Asynchronous Receiver Transmitter (first UART),
   said fan controller includes a second Universal Asynchronous Receiver Transmitter (second UART),
   said first and second UARTs being connected by said second connection and being adapted to exchange data via said second connection when said system is operating in a particular mode.

5. The system recited in claim 1 wherein said system controller includes:
   a register for storing a number indicating the desired mode of operation of said system, and,
   a driver for producing PWM pulses at a frequency indicated by the number stored in said register.

6. The system recited in claim 1 wherein:
   said system controller includes a first microprocessor,
   said fan controller includes a second microprocessor, and
   during a selected mode of operation data is bi-directionally transferred from said first microprocessor to said second microprocessor.

7. A fan control system for controlling the speed of operation of a fan, said fan control system being operable in first and second modes, said fan control system including:
   a system controller, a fan controller and first and second signal paths between said system controller and said fan controller,
   said system controller being adapted to generate and transmit on said first signal path a Pulse Width Modulated (PWM) signal, the frequency of which indicates the mode in which said fan control system is operating and the duty cycle of which indicates the desired fan speed during said first mode of operation, and said fan controller being adapted to generate and transmit on said second signal path, during said first mode of operation, a tachometer signal which indicates the actual operating speed of said fan, said system controller and said fan controller being adapted to communicate on said second signal path, bi-directionally during said second mode of operation.

8. The fan control system recited in claim 7 wherein said system controller includes a microprocessor.

9. The fan control system recited in claim 7 wherein said system controller includes a first microprocessor and said fan controller includes a second microprocessor.

10. The fan control system recited in claim 7 wherein:

said system controller includes a microprocessor and a first Universal Asynchronous Receiver Transmitter (UART) connected to said microprocessor, said fan controller includes a second microprocessor and a second UART connected to said second microprocessor, said first and second UART's being connected by said second communication path and adapted to exchange data via said second communication path when said system is operating in said second mode.

11. The fan control system recited in claim 7 wherein said system controller includes:

a microprocessor, a register for storing data indicating the desired mode of operation of said system, and, a driver for producing PWM signals at a frequency indicated by the data stored in said register, said microprocessor being adapted to store data in said register indicating the desired mode of operation of said system.

12. The fan control system recited in claim 7 wherein:

said system controller includes a first microprocessor, said fan controller includes a second microprocessor, and during said second mode of operation data is transferred bi-directionally between said first and second microprocessors.

13. A method for transmitting data between a system control unit to a fan control unit to control the speed of a fan including the steps of:

modulating the duty cycle of a Pulse Width Modulated (PWM) signal and transmitting said PWM signal from said system control unit to said fan control unit in order to transit a desired fan speed from said system control unit to said fan control unit, and modulating the frequency of said PWM signal to transmit a second type of information from said system control unit to said fan control unit.

14. The method recited in claim 13 wherein said system control unit and said fan control unit communicate on first and second communications paths, different communication protocols being used on said second communication path during different modes of operation.

15. The method recited in claim 13 wherein the frequency of said PWM signal is changed from a first frequency to a second frequency to signal said fan controller to switch from a first mode of operation to a second mode of operation.

16. The method in claim 15 wherein in said first mode of operation, a second signal path is used to transmit a tachometer signal indicating fan speed from said fan controller to said system controller and wherein in a second mode, said second signal path is used to transmit digital information signals bi-directionally between said system controller and said fan controller.

17. The method recited in claim 16 wherein in said second mode signals are transmitted on said second signal path asynchronously.

18. A fan control system for controlling the speed of a fan, said fan control system being able to operate in a legacy mode or in an enhanced communication mode, said fan control system including:

a first controller that specifies a desired fan speed, a fan controller that controls the speed of said fan, a first signal path between said first controller and said fan controller, said first controller being adapted to transmit on said first signal path a Pulse Width Modulated (PWM) signal, the frequency of which indicates the mode in which said system is operating, and during said legacy mode, the duty cycle of which indicates the desired fan speed, and a second signal path between said first controller and said fan controller, said second signal path carrying during said legacy mode a tachometer signal indicating the actual operating speed of said fan, and during said enhanced communication mode, bi-directional asynchronous communication signals between said first controller and said fan controller.

19. The fan control system recited in claim 18 wherein:

said first controller is a system controller, and wherein said system controller includes a first microprocessor and a first Universal Asynchronous Receiver Transmitter (UART) connected between said first microprocessor and said second communication path, and said fan controller includes a second microprocessor and a Universal Asynchronous Receiver transmitter (UART) connected between said second microprocessor and said second communication path.

20. The fan control system recited in claim 19 including a fan speed sensor connected to said fan system controller, said fan speed sensor generating a tachometer signal which is transmitted on said second communication path when said system is operating in legacy mode.

* * * * *